(12) United States Patent
Belyansky et al.

(10) Patent No.: US 7,863,646 B2
(45) Date of Patent: Jan. 4, 2011

(54) DUAL OXIDE STRESS LINER

(75) Inventors: Michael P. Belyansky, Bethel, CT (US);
Xiangdong Chen, Poughquag, NY (US);
Thomas W. Dyer, Pleasant Valley, NY (US); Geng Wang, Stormville, NY (US);
Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 394 days.

(21) Appl. No.: 11/956,043

(22) Filed: Dec. 13, 2007

(65) Prior Publication Data

US 2009/0152638 A1 Jun. 18, 2009

(51) Int. Cl.
*H01L 31/111* (2006.01)
*H01L 21/00* (2006.01)
(52) U.S. Cl. .......................... 257/178; 438/53
(58) Field of Classification Search .................. 257/369,
257/108, 178, 324, 325, E23.01–E23.059;
438/48–56
See application file for complete search history.

(56) References Cited

U.S. PATENT DOCUMENTS

| 6,995,065 | B2 | 2/2006 | Chou et al. |
| 7,585,704 | B2 * | 9/2009 | Belyansky et al. .......... 438/131 |
| 2006/0226490 | A1 | 10/2006 | Burnett et al. |

\* cited by examiner

*Primary Examiner*—Calvin Lee
(74) *Attorney, Agent, or Firm*—Gibb I.P. Law Firm, LLC; Yuanmin Cai, Esq.

(57) ABSTRACT

A transistor structure includes a first type of transistor (e.g., P-type) positioned in a first area of the substrate, and a second type of transistor (e.g., N-type) positioned in a second area of the substrate. A first type of stressing layer (compressive conformal nitride) is positioned above the first type of transistor and a second type of stressing layer (compressive tensile nitride) is positioned above the second type of transistor. In addition, another first type of stressing layer (compressive oxide) is positioned above the first type of transistor. Further, another second type of stressing layer (compressive oxide) is positioned above the second type of transistor.

5 Claims, 1 Drawing Sheet

DUAL OXIDE STRESS LINER

FIELD OF THE INVENTION

The embodiments of the invention generally relate to stressing layers used with complementary transistor structures and more particularly to oxide stressing layers that have a conformal bottom and a planar top.

BACKGROUND

Within the technology of complementary metal oxide semiconductor (CMOS) transistors, dual stress nitride liners have been used to improve both N-type and P-type transistor performance. As the technology is scaled down, the performance improvement diminishes because the thickness of the stress liner is limited by the pitch size and a phenomenon known as "pinch-off" happens when the pitch size is very small. Pinch off prevents the stressing layer from forming properly, as extremely small pitch sizes provide insufficient room for the stressing layer to form, which can create shear stresses as adjacent stressing layers pinch against one another.

SUMMARY

To address such issues one embodiment herein comprises a transistor structure that includes a first type of transistor (e.g., P-type) positioned in a first area of the substrate, and a second type of transistor (e.g., N-type) positioned in a second area of the substrate. A first type of stressing layer (compressive conformal nitride) is positioned above the first type of transistor and a second type of stressing layer (compressive tensile nitride) is positioned above the second type of transistor.

In addition, another first type of stressing layer (compressive oxide) is positioned above the first type of transistor. The bottom side of the first type of oxide stressing layer (that is adjacent the compressive conformal nitride) has a conformal shape matching a corresponding shape of the compressive conformal nitride, and the top side of the first type of oxide stressing layer (that is opposite the bottom side of the first type of oxide stressing layer) comprises a planar surface.

Further, another second type of stressing layer (compressive oxide) is positioned above the second type of transistor. The bottom side of the second type of oxide stressing layer (that is adjacent the compressive conformal nitride) has a conformal shape matching a corresponding shape of the compressive conformal nitride, and the top side of the second type of oxide stressing layer (that is opposite the bottom side of the second type of oxide stressing layer) comprises a planar surface.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
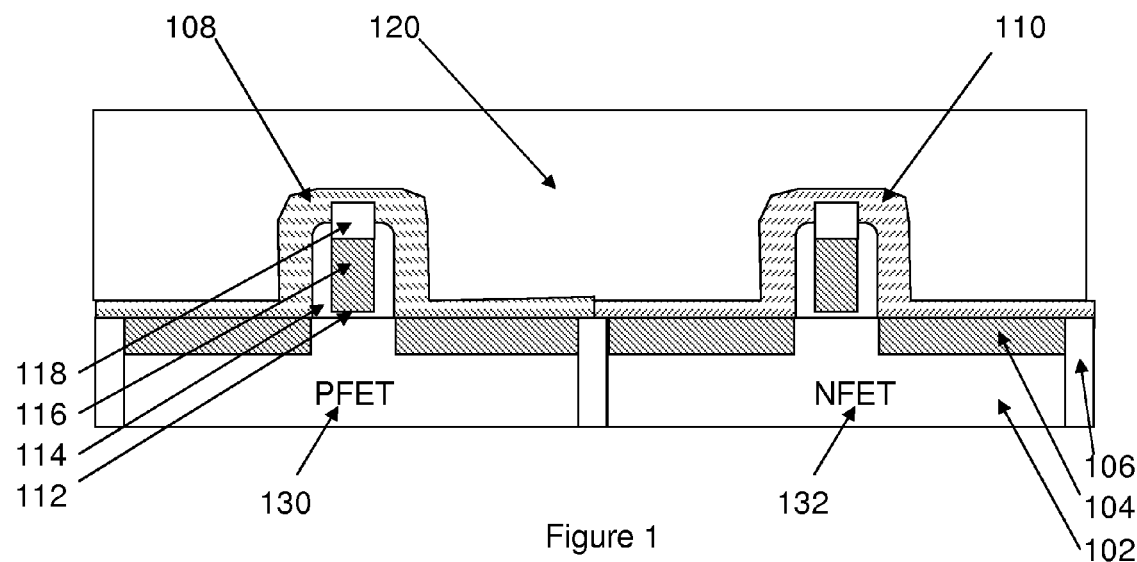
FIG. 1 is a cross-sectional schematic diagram of a complementary transistor structure.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, as CMOS technology is scaled down, the performance improvement of compressive and tensile nitride stressing layers diminishes because the thickness of the stress liner is limited by the pitch size and a phenomenon known as "pinch-off" happens when the pitch size is small, which prevents the stressing layers from forming properly.

FIG. 1 illustrates a typical complementary field effect transistor structure where the transistor on the left side of FIG. 1 comprises a positive or P-type field effect transistor (PFET) 130 and where the transistor on the right side of FIG. 1 comprises a negative or N-type field effect transistor (NFET) 132. Such field effect transistors include a substrate 102 having a channel region; shallow trench isolation regions 106; source/drain regions 104; gate oxides 112; gate conductors 114 above the gate oxide 112; gate caps 118 at the tops of the gate conductors 116; and sidewall spacers 114 along the sides of the gate conductor 116.

A nitride stressing layer that causes compressive stress is shown as a compressive layer 108 positioned above the PFET in FIG. 1. A different nitride stressing layer that causes tensile stress is shown as a tensile layer (e.g., nitrite, etc.) 110 positioned above the NFET in FIG. 1. A non-stressed or neutral stressing insulator layer (inter-layer dielectric (IDL)) is shown as item 120 in FIG. 1. These stressing layers 108, 110 increase the performance of the different types of transistors. However, such nitride stressing layers can be pinched off as the pitch of the transistors becomes smaller and smaller.

In order to address such issues, the present embodiments use an oxide stressing layer that is relatively thicker than the conventional nitride layers. Just like nitrides, oxides can also produce tensile stress and compressive stress. For example, an oxide formed in a sub-atmospheric chemical vapor deposition (SACVD) process forms tensile stress. Similarly, an oxide formed in a high density plasma process (HDP oxide) forms as a compressive oxide. However, compared with nitride, oxide more easily fills minimum pitch areas. Further, with oxides, a much thicker stressed liner can be used to achieve the highest strain in the channel.

Figure 2:
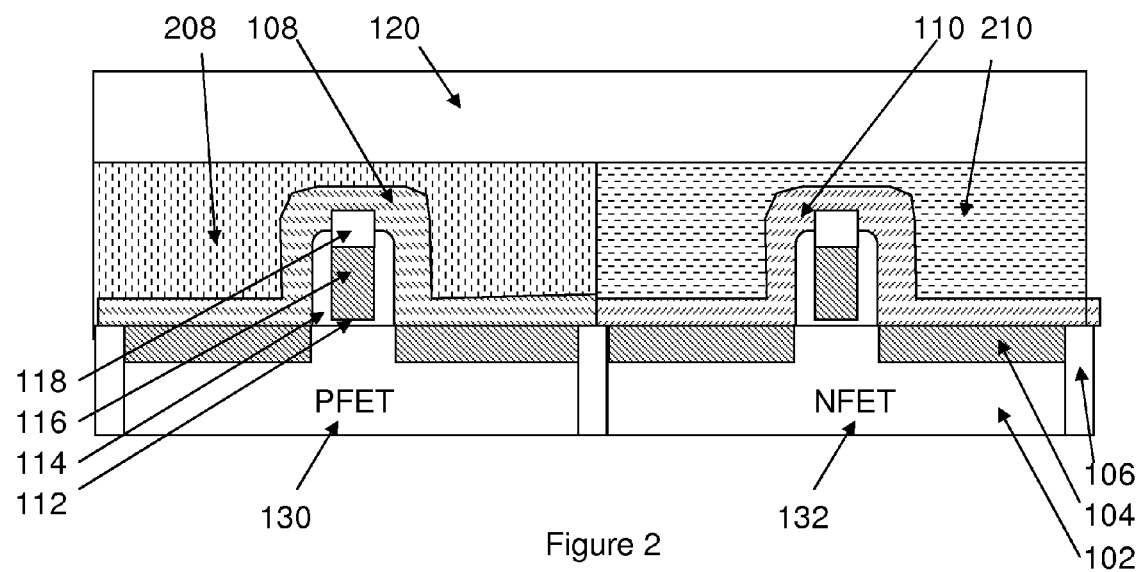
FIG. 2 is a cross-sectional schematic diagram of a complementary transistor structure according to embodiments herein.

More specifically, as shown in FIG. 2, one embodiment herein comprises a transistor structure that includes the same first type of transistor (e.g., P-type) 130 positioned in a first area of the substrate 102, and the same second type of transistor (e.g., N-type) 132 positioned in a second area of the substrate 102.

In addition, another first type (compressive oxide) of stressing layer 208 is positioned above the first type of transistor 130. The bottom side of the first type of oxide stressing layer 208 (that is adjacent the compressive conformal nitride 108) has a conformal shape matching a corresponding shape of the compressive conformal nitride 108, and the top side of the first type of oxide stressing layer 208 (that is opposite the bottom side of the first type of oxide stressing layer) comprises a planar surface.

Further, another second type (compressive oxide) of stressing layer 210 is positioned above the second type of transistor 132. The bottom side of the second type of oxide stressing layer 210 (that is adjacent the compressive conformal nitride 110) has a conformal shape matching a corresponding shape of the compressive conformal nitride 110, and the top side of the second type of oxide stressing layer 210 (that is opposite the bottom side of the second type of oxide stressing layer) comprises a planar surface.

The various deposition, patterning, polishing, etching, etc. processes that are performed and the material selections that are made in the creation of such field effect transistors are well known as evidence by U.S. Pat. No. 6,995,065 and U.S. Patent Publication 2006/0226490 (which are incorporated herein by reference) and the details of such processing are not discussed herein to focus the reader on the salient aspects of the invention. Further, while one type of specific device is illustrated in the drawings, those ordinarily skilled in the art would understand that the invention is not strictly limited to the specific device shown, but instead that the invention is generally applicable to all similar devices.

Further, a number of different processes can be utilized to form the structures described herein. For example, a compressive or tensile oxide can be formed over both transistors, selectively removed from one type of transistor and then the other type of stressing oxide can be formed over the remaining transistors. Similarly, one of the types of transistors can be protected (e.g., with a ultraviolet blocking mask layer) while the stressing oxide is selectively formed over the other transistor, followed by a reverse process over the opposite transistors. Chemical mechanical polishing (CMP) and other similar processes can be used to create the planar upper surface of the oxide stressing layers. In addition, as would be understood by those ordinarily skilled in the art, many other methodologies could be utilized to form the structures described herein.

As described above, the embodiments herein avoid the problems of nitride stressing layer pinching that often occurs as the size of transistors is reduced. By utilizing oxide as an additional stressing material in addition to the nitrides, much smaller spaces can be filled with the oxides stressing material. Further, the oxide stressing layers can be formed to be relatively thicker than the nitride layers, which creates greater stress upon the transistor. Thus, the embodiments herein present a number of substantial advantages when compared to conventional structures.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. A transistor structure comprising:
   a substrate;
   a first type of transistor positioned in a first area of said substrate;
   a second type of transistor positioned in a second area of said substrate;
   a first type of conformal nitride stressing layer positioned above said first type of transistor;
   a second type of conformal nitride stressing layer positioned above said second type of transistor;
   a first type of oxide stressing layer positioned above said first type of transistor, wherein a bottom side of said first type of oxide stressing layer that is adjacent said first type of transistor has a conformal shape matching a corresponding shape of said first type of conformal nitride stressing layer, and wherein a top side of said first type of oxide stressing layer that is opposite said bottom side of said first type of oxide stressing layer comprises a planar surface; and
   a second type of oxide stressing layer positioned above said second type of transistor, wherein a bottom side of said second type of oxide stressing layer that is adjacent said second type of transistor has a conformal shape matching a corresponding shape of said second type of conformal nitride stressing layer, and wherein a top side of said second type of oxide stressing layer that is opposite said bottom side of said second type of oxide stressing layer comprises a planar surface,
   wherein said first type of oxide stressing layer comprises a compressive oxide stressing layer, and wherein said second type of oxide stressing layer comprises a tensile oxide stressing layer.

2. The transistor structure according to claim 1, all features of which are hereby incorporated by reference, wherein said first type of transistor comprises a P-type transistor, and wherein said second type of transistor comprises an N-type transistor.

3. A transistor structure comprising:
   a substrate;
   a first type of transistor positioned in a first area of said substrate;
   a second type of transistor positioned in a second area of said substrate;
   a compressive conformal nitride stressing layer positioned above said first type of transistor;
   a tensile conformal nitride stressing layer positioned above said second type of transistor;
   a compressive oxide stressing layer positioned above said first type of transistor, wherein a bottom side of said compressive oxide stressing layer that is adjacent said first type of transistor has a conformal shape matching a corresponding shape of said compressive conformal nitride stressing layer, and wherein a top side of said compressive oxide stressing layer that is opposite said bottom side of said compressive oxide stressing layer comprises a planar surface; and
   a tensile oxide stressing layer positioned above said second type of transistor, wherein a bottom side of said tensile oxide stressing layer that is adjacent said second type of transistor has a conformal shape matching a corresponding shape of said tensile conformal nitride stressing layer, and wherein a top side of said tensile oxide stressing layer that is opposite said bottom side of said tensile oxide stressing layer comprises a planar surface.

4. The transistor structure according to claim 3, wherein said first type of transistor comprises a P-type transistor, and wherein said second type of transistor comprises an N-type transistor.

5. The transistor structure according to claim 3, wherein said compressive oxide stressing layer and said tensile oxide stressing layer are thicker than said compressive conformal nitride stressing layer and said tensile conformal nitride stressing layer.

* * * * *